(12) United States Patent
Bruguier et al.

(10) Patent No.: US 9,588,439 B1
(45) Date of Patent: Mar. 7, 2017

(54) INFORMATION MATRIX CREATION AND CALIBRATION TEST PATTERN SELECTION BASED ON COMPUTATIONAL LITHOGRAPHY MODEL PARAMETERS

(75) Inventors: Antoine Jean Bruguier, Milpitas, CA (US); Yu Cao, Saratoga, CA (US); Jun Ye, Palo Alto, CA (US); Wenjin Shao, Sunnyvale, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 427 days.

(21) Appl. No.: 13/332,303

(22) Filed: Dec. 20, 2011

Related U.S. Application Data

(60) Provisional application No. 61/425,717, filed on Dec. 21, 2010.

(51) Int. Cl.
*G06F 17/10* (2006.01)
*G06F 7/60* (2006.01)
*G03F 7/20* (2006.01)
*G06F 17/50* (2006.01)

(52) U.S. Cl.
CPC .......... *G03F 7/705* (2013.01); *G03F 7/70516* (2013.01); *G03F 7/70625* (2013.01); *G06F 17/5009* (2013.01)

(58) Field of Classification Search
CPC .. G03F 7/705; G03F 7/70516; G03F 7/70625; G06F 17/5009
USPC ............................................................. 703/2
See application file for complete search history.

(56) References Cited

U.S. PATENT DOCUMENTS

| | | | | |
|---|---|---|---|---|
| 5,680,588 | A * | 10/1997 | Gortych et al. | 430/30 |
| 6,046,792 | A * | 4/2000 | Van Der Werf et al. | 355/53 |
| 6,871,337 | B2 * | 3/2005 | Socha | 716/54 |
| 7,003,758 | B2 * | 2/2006 | Ye et al. | 716/52 |
| 7,148,959 | B2 * | 12/2006 | Dusa et al. | 356/237.4 |
| 7,587,704 | B2 * | 9/2009 | Ye et al. | 716/51 |

(Continued)

OTHER PUBLICATIONS

Zhang, Youping, Mu Feng, and Hua-yu Liu. "A focus exposure matrix model for full chip lithography manufacturability check and optical proximity correction." Photomask and Next Generation Lithography Mask Technology XIII. International Society for Optics and Photonics, 2006.*

(Continued)

*Primary Examiner* — Aniss Chad
(74) *Attorney, Agent, or Firm* — Pillsbury Winthrop Shaw Pittman LLP

(57) ABSTRACT

Embodiments of the present invention describe methods of selecting a subset of test patterns from an initial larger set of test patterns for calibrating a computational lithography model. An example method comprises: generating an information matrix for the initial larger set of test patterns, wherein the terms of the information matrix comprise one or more identified model parameters that represent a lithographic process response; and, executing a selection algorithm using terms of the information matrix to select the subset of test patterns that effectively determines values of the identified model parameters that contribute significantly in the lithographic process response, wherein the subset of test patterns characteristically represents the initial larger set of test patterns. The selection algorithm explores coverage relationships existing in the initial larger set of test patterns.

24 Claims, 10 Drawing Sheets

(56) References Cited

U.S. PATENT DOCUMENTS

| | | | |
|---|---|---|---|
| 7,747,978 B2* | 6/2010 | Ye et al. | 716/50 |
| 7,765,021 B2* | 7/2010 | Mansfield et al. | 700/108 |
| 7,788,628 B1* | 8/2010 | Wei | 716/51 |
| 8,065,636 B2* | 11/2011 | Ye et al. | 716/50 |
| 8,142,966 B2* | 3/2012 | Izikson | G03F 7/70641 |
| | | | 257/48 |
| 8,245,160 B2* | 8/2012 | Ye et al. | 716/50 |
| 8,694,928 B2* | 4/2014 | Cao et al. | 716/54 |
| 2005/0015233 A1* | 1/2005 | Gordon | 703/13 |
| 2005/0195379 A1* | 9/2005 | Stanton et al. | 355/67 |
| 2010/0122225 A1 | 5/2010 | Cao et al. | |
| 2011/0113390 A1* | 5/2011 | Cao et al. | 716/55 |
| 2011/0224956 A1* | 9/2011 | Ye et al. | 703/1 |
| 2012/0005637 A9* | 1/2012 | Cao et al. | 716/55 |

OTHER PUBLICATIONS

Chen, Luoqi, et al. "Predictive focus exposure modeling (FEM) for full-chip lithography." SPIE 31st International Symposium on Advanced Lithography. International Society for Optics and Photonics, 2006.*

Young-Chang Kim et al., "Optical Proximity Correction for Elongated Contact-Hole Printing," Proc. of SPIE, vol. 6924, pp. 69243Q-1-69243Q-11 (2008).

Kyle Patterson et al. "Improving Model-Based OPC Performance for the 65nm Node Through Calibration Set Optimization," Proc. of SPIE, vol. 5756, pp. 294-301 (2005).

* cited by examiner

INFORMATION MATRIX CREATION AND CALIBRATION TEST PATTERN SELECTION BASED ON COMPUTATIONAL LITHOGRAPHY MODEL PARAMETERS

CROSS-REFERENCE TO RELATED APPLICATIONS

This application claims priority to U.S. Provisional Application No. 61/425,717, filed Dec. 21, 2010, the contents of which are incorporated by reference herein in their entirety.

COPYRIGHT AUTHORIZATION

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The technical field of the present invention relates generally to test patterns for model calibration associated with a lithography process, and more specifically to selecting an optimal set of test patterns from a larger set of test patterns.

BACKGROUND OF THE INVENTION

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as "Moore's law". At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light. Even in the case of extreme ultraviolet (EUV) imaging with a wavelength of about 13.5 nm, an accurate model must capture the resist effects.

This process, in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed, NA is the numerical aperture of the projection optics, CD is the "critical dimension"—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as "resolution enhancement techniques" (RET).

As one important example, optical proximity correction (OPC, sometimes also referred to as "optical and process correction") addresses the fact that the final size and placement of a printed feature on the wafer will not simply be a function of the size and placement of the corresponding feature on the mask. It is noted that the terms "mask" and "reticle" are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of "sub-resolution assist" features that are not intended to print themselves, but will affect the properties of an associated primary feature.

The application of model-based OPC to a target design requires good process models and considerable computational resources, given the many millions of features typically present in a chip design. The OPC is essentially a very large optimization problem. In the general case, there is no closed-form solution to this problem, and OPC vendors use an approximate, iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

OPC and other RET verification may be based on numerical modeling systems and methods, and commercial products are available based on the computational lithography ("CL") techniques that are developed for generic or specific lithography machines.

OPC and other RET require robust models that describe the lithography process precisely. Calibration procedures for such lithography models are thus required that provide models being valid, robust and accurate across the process window. Currently, calibration is done using a certain number of 1-dimensional and/or 2-dimensional gauge patterns with wafer measurements. More specifically, those 1-dimensional gauge patterns include, but are not limited to, line-space patterns with varying pitch and CD, isolated lines, multiple lines, etc. and the 2-dimensional gauge patterns typically include line-ends, contacts, and randomly selected SRAM (Static Random Access Memory) patterns. Those skilled in the arts will understand that the present invention is generic enough to accommodate any type of pattern. These patterns are then imaged onto a wafer and resulting wafer CDs and/or contact energy are measured. The original gauge patterns and their wafer measurements are then used jointly to determine the model parameters which minimize the difference between model predictions and wafer measurements.

In current practice, the selection of gauge patterns is rather arbitrary. They may simply be chosen from experience or randomly chosen from the real circuit patterns. Such patterns are often insufficient for calibration or too computationally-intensive due to redundancy. In particular, for some parameters, all the patterns may be quite insensitive thus it may be difficult to determine the parameter values due to measurement inaccuracies. While on the other hand, many patterns may have very similar responses to parameter variations thus some of them are redundant and wafer measurements on these redundant patterns waste a lot of resources.

Meanwhile, CL models need to accurately predict the actual on-wafer pattern contours across a very large collection of possible geometric layout patterns. Therefore, both the proper choice of the model formulation to be employed and the accurate determination of values for all model parameters are very important.

Moreover, in the calibration of a CL model, wafer CD measurements for the selected test patterns are needed to optimize the model parameters. Collecting such metrology data is often time-consuming and expensive. In light of this effort, for the OPC application, these calibrations are typically done only once per technology node per target layer. For CL products in manufacturing, these calibrations need to be done for many scanners and on a somewhat regular basis. Therefore, model calibration procedures should address the issue of how to minimize the number of test structures that need to be measured without compromising the prediction accuracy of the resulting model.

Traditional approaches in model calibration aim primarily to provide a good description of the imaging behavior of those patterns that are known to be important to the physical circuit design community. Typically, this involves a substantial number of pattern types, each instantiated over an appropriate range of geometric variations. One of the most important examples is line CD versus pitch for the poly layer, for a number of frequently used transistor channel lengths (poly line CD) and from dense lines (minimum pitch) to isolated lines. However, in modern lithography, the optical range of influence (ambit) is much larger than the typical test structure and therefore it is no longer true that accurate modeling of a pre-selected number of relatively small test patterns guarantees accurate prediction of these patterns in their actual circuit environments. Most of the geometry-based approaches are somewhat heuristic in nature, and are often prone to one or both of the following drawbacks.

Firstly, the strong focus on predefined patterns means that there is no explicit consideration for proper coverage of model parameters and for guaranteeing that all the significant physical/chemical characteristics in a lithography process are suitably represented by these parameters. In the case of a model not based on first principle physics/chemistry, the predefined patterns similarly need to allow accurate calibration of the model's parameters. Due to a lack of discriminating patterns, patterns can be poorly determined or they can exhibit a high degree of degeneracy with other parameters. Either way, the methods routinely fail to properly describe the change in imaging behavior outside the conditions included in the model characterization.

Secondly, for some of the physical/chemical properties and associated model parameters that are captured by the calibration method, the approach is not economical and too many measurements provide essentially redundant information.

Thirdly, the current gauge selection methods are not easily generalizable. Every time a new gauge geometry is supplied, the user needs to establish new rules.

If a gauge selection is done using a purely non-geometry-based approach, then specific features of a given gauge are ignored.

Additionally, none of the traditional methods describe a comprehensive method to select the gauges once their characterization is done.

The increased use of computational lithography models outside their original conventional application in OPC implies that the model calibration procedures need to be adjusted also, such that the resulting models are at least: a) better in predicting imaging behavior for pattern types not included in the calibration test data, b) better in predicting imaging behavior for variations in the lithographic processing conditions (mask, scanner, resist, or etch related), and c) more frugal in terms of the amount of metrology needed. Accordingly, a need exists to address these and other shortfalls of the traditional methods.

SUMMARY OF THE INVENTION

The present invention provides a number of innovations in the area of test pattern selection for model calibration that address the requirements mentioned above, among others. A significant advantage of the present invention is that it provides an improved way to measure characteristics of a given test pattern, and at the same time, provides an efficient way to select a subset of test patterns that adequately represent intended lithographic responses. The terms "calibration test pattern", "test pattern" and "gauge" are used interchangeably.

According to some aspects, the pattern selection algorithms of the present invention can be applied to any existing larger set of candidate test patterns for model calibration. These test patterns may stem from any combination of the following sources: a dedicated test mask included as part of a tool; a test mask developed by customers (such as, OPC customers as part of their OPC modeling efforts); patterns selected from an actual product reticle in use by a customer. According to some aspects, the present invention automatically selects those test patterns that are most effective in determining the model parameter values from an existing larger set of candidate test patterns, as opposed to designing optimal test patterns. In other words, any type of generic test pattern can be accommodated by the methods of the present invention.

The methods of the present invention are generic enough to accommodate model parameters from a variety of models, such as the optical model, the resist model, and/or the etch model.

Embodiments of the present invention describes a method of selecting a subset of test patterns from an initial larger set of test patterns for calibrating a computational lithography model, the method comprising: generating an information matrix for the initial larger set of test patterns, wherein the terms of the information matrix comprise one or more identified model parameters that represent a lithographic process response; and, executing a selection algorithm using terms of the information matrix to select the subset of test patterns that effectively determines values of the identified model parameters that contribute significantly in the lithographic process response, wherein the subset of test patterns characteristically represents the initial larger set of test patterns. The selection algorithm explores coverage relationships existing in the initial larger set of test patterns.

The method of generating an information matrix as described in the present invention encompasses various possibilities, including but not limited to computation of information matrix from CD change, from resist image change, from aerial image intensity change etc. Once the information matrix is generated, the smart selection of patterns may sample uniformly in parametric space to pick the data points (i.e. pick the test patterns represented by the data points) to calibrate a CL model. The most extreme data points of a solution may be picked.

These and other aspects of the present invention, including systems and computer program products corresponding to the above methods, will be apparent to a person skilled in the art in view of the following drawings and detailed description.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE EXAMPLE EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
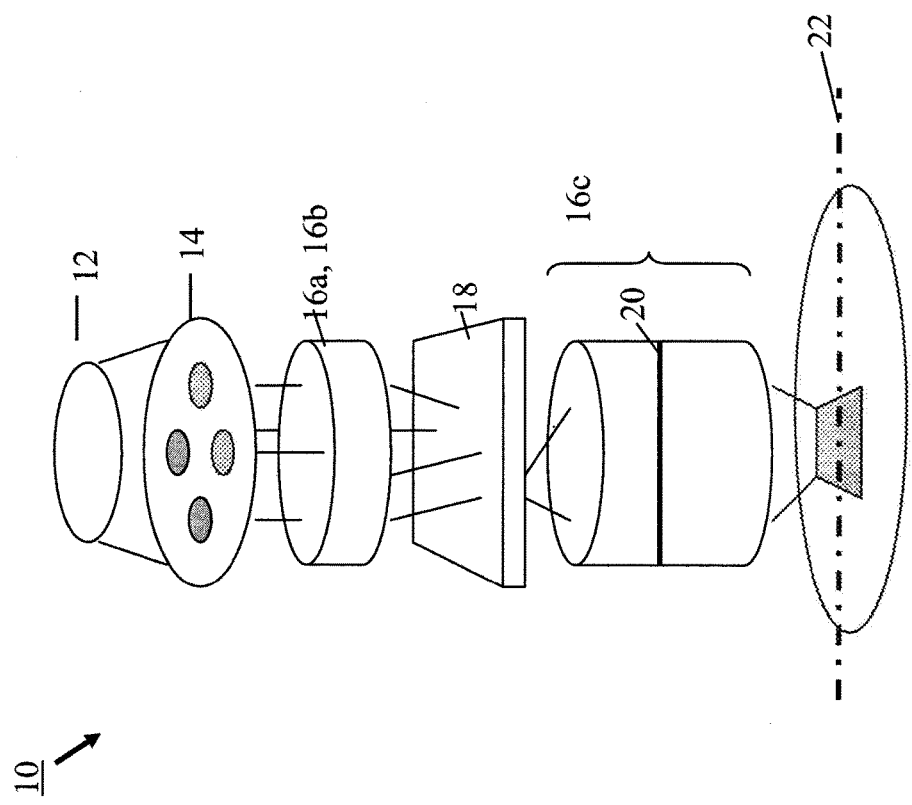
FIG. 1 is a block diagram of various subsystems of a lithography system according to example implementations of the present invention.

General Environment in a Lithography System for Implementing Example Embodiments of the Present Invention Prior to discussing the present invention, a brief discussion regarding the overall simulation and imaging process is provided. FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\Theta_{max})$.

Figure 2:
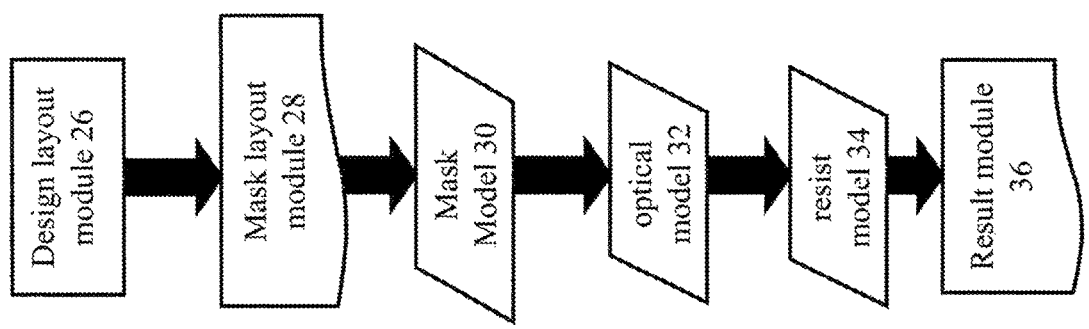
FIG. 2 is a block diagram of simulation models corresponding to the subsystems in FIG. 1.

In a lithography simulation system, these major system components can be described by separate functional modules, for example, as illustrated in FIG. 2. Referring to FIG. 2, the functional modules include the design layout module 26, which defines the target design; the mask layout module 28, which defines the mask to be utilized in imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma (σ) settings as well as any particular illumination source shape, where σ (or sigma) is outer radial extent of the illuminator. The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS. Those skilled in the art will understand that the input file format is irrelevant.

Example Methods of the Present Invention

In general, the connection between the optical and the resist model is a simulated aerial image within the resist layer, which arises from the projection of light onto the substrate, refraction at the resist interface and multiple reflections in the resist film stack. The light intensity distribution (aerial image) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

The CL model formulation is thus used to describe the known physics and chemistry. The CL model can either be based on first-principle physics/chemistry or be empirical, i.e. based on experience and/or observation. Some of the empirical models can be referred to as heuristic model, i.e. a model based on trial and errors. For physical models, one or more of the model parameters corresponds to a distinct physical or chemical effect; the model formulation may set bounds or constraints on how well the calibrated model can describe the reality.

The present inventors recognize that a test pattern selection result (i.e. "pattern coverage") should therefore be able to excite all the known physics and chemistry in the model formulation, making sure that the wafer data for the test patterns can drive the model calibration to the parameter values that realize the constraints imposed by the formulation. Pattern selection does not change the physical and chemical effects contained in the model, but should preferably help to adequately excite these effects such that the degrees to which they manifest themselves in a specific lithography process can be efficiently identified based on the wafer measurements for the selected test patterns. The insight here is that the method of determining what is an effective subset of patterns may depend on many factors, such as: whether the model is based on first-principles or is an empirical model, whether the goal is to select the fewest patterns to calibrate the model to make the process most efficient computationally, whether a predefined predictive accuracy goal is set, whether a customer has provided a preferred set of test patterns that must be included in any subset, etc. Note that these are just illustrative examples, and do not limit the scope of the present invention.

Figure 3:
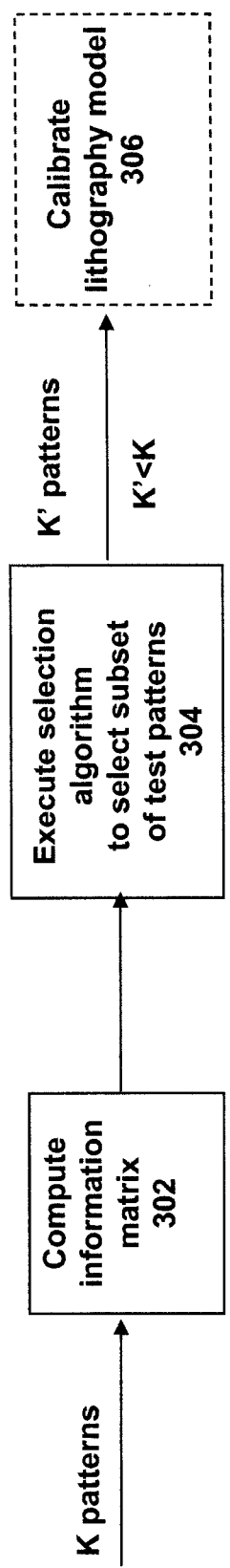
FIG. 3 is a flow diagram illustrating aspects of an example methodology of test pattern selection according to the invention.

More particularly, FIG. 3 is a flow diagram illustrating an example of how the test pattern selection methodologies according to aspects of the present invention are useful in calibrating a model that provides accurate and efficient CL results. A general aspect of the invention is to select an optimal subset of test patterns (containing K' no. of test patterns) in step 304 from a larger set of test patterns (containing K no. of test patterns, where K>K') as described in more detail below. Another important aspect of the invention is to create a generic information matrix in step 302, which contains all the information necessary for model calibration, irrespective of what particular calibration method is being used. For example, the calibration method may use an optical model that uses the physical properties of the optical system using the first principles, or it can use a resist model, which is based on a virtual image (i.e. not a physical image) of the mask pattern within the resist layer. We shall describe in more detail below how to build the information matrix. But persons skilled in the art will appreciate that the illustrative examples of models are not limiting to the scope of the invention.

The present inventors have identified a number of mathematical approaches that alone or in various combinations would be applicable in the selection of the subset of test patterns for optimal test pattern coverage. Co-owned co-pending application Ser. No. 12/613,244, published as US 2010-0122225, titled, "Pattern Selection for Lithographic Model Calibration," describes further details of the model-parameter-sensitivity-based selection of the subset of test patterns, which is incorporated herein by reference. This approach is usually preferred for first-principle-based models. On the other hand, the present application illustrates methods of empirical modeling. Those skilled in the art will understand that experimentation may be used to determine which approach is better. Additionally, the generation of the information matrix is irrespective of whether a first-principle-based method is used, or an empirical method is used.

According to the model-parameter-sensitivity-based selection (US publication no. 2010-0122225), the test patterns are selected such that a selected test pattern is very sensitive to one or more specific model parameters, i.e., small changes in the parameters should be able to induce observable changes in the wafer CD for the test pattern. The test patterns are further selected such that the effect of different model parameters can be clearly distinguished. Test patterns with similar sensitivity to the model parameters are identified, grouped and selected such that no unnecessary duplication of test patterns is retained in the selection results. By achieving the selection above, the smallest possible set of test patterns is identified that achieves high sensitivity to the individual parameters as well as clear distinction between the contributions from different model parameters. In at least some embodiments of the present invention, rather than exploring the sensitivity of a test pattern to a model parameter, the emphasis is exploring the coverage relationship that already exists between various test patterns, based on their location in a parametric space. This will be elaborated further below.

Referring back to FIG. 3, the two key steps of an example embodiment of the present invention are: 1) generation of the information matrix from the input values of model parameters (step 302), where the information matrix comprise terms covering the test patterns included in the initial larger set of K test patterns, from which a 'coverage relationship' existing among the test patterns can be deduced; and 2) execute a selection algorithm to select the subset of K' test patterns from the initial larger set of K patterns, where (K>K'), in a way so that the characteristics of all K gauges are sufficiently covered by the K' test patterns Note that in the context of the present invention, the term "model parameter" has been defined broadly to indicate actual terms of an information matrix, or to indicate a characteristic of the chosen model that controls the value of the terms of the information matrix. After having selected the subset of K' patterns, the calibration of the lithographic model can proceed using conventional methods, except with fewer gauges (step 306), resulting in a computationally efficient calibration. In the context of the present invention, the model calibration step 306 is optional, and therefore, indicated by the dashed outline.

The terms of the information matrix may be constructed from a variety of lithographic responses corresponding to the model parameters, such as, critical dimensions and/or change in critical dimension of features of the test patterns, a resist image and/or change in resist image, and, an aerial image (AI) intensity and/or change in aerial image intensity. The AI intensity-based approach is also referred to as Transmission Cross Co-efficient (TCC)-based information matrix approach. Change of AI may also be in response to change of illumination source setting in the simulation.

Figure 4A:
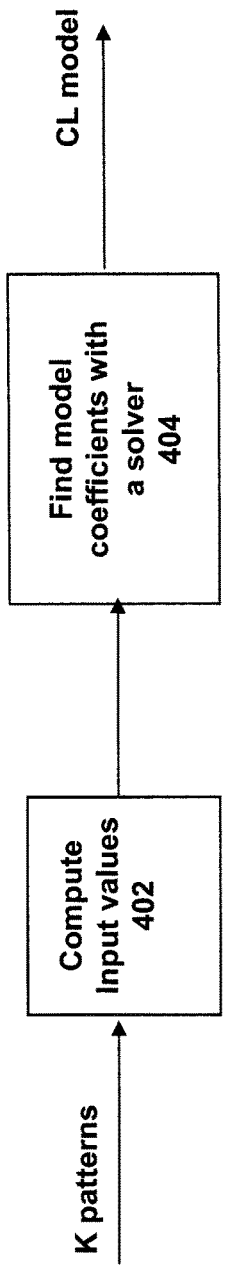
FIGS. 4A and 4B are flowcharts illustrating example methods of calculation according to aspects of the invention.
Figure 4B:
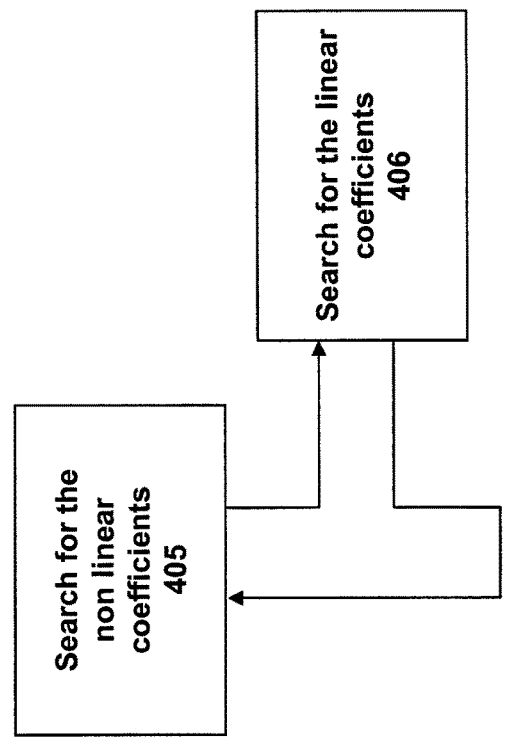

FIG. 4A-4B shed light on the process of computing the information matrix. In a typical computational lithography (CL)-based calibration process, usually input values for model parameters for each of the K gauges are calculated in step 402, and then a predefined cost function of the input variables is minimized by a solver to find required coefficients (step 404) to come up with the CL model. Step 404 may have sub-steps, as shown in FIG. 4B. The solver in step 404 may have a linear solver and a non-linear solver. A linear solver is used in step 406 to calculate linear coefficients (and RMS errors), and is repeatedly called by a non-linear solver (step 405). The solver depends on the type of computational lithography model (e.g., resist model, TCC tuning model) used in an application. A person skilled in the art will understand that the type of solver does not limit the scope of the invention.

While step 402 is known in the art, the unique characteristic of the present invention is that the behavior of the solver is entirely determined by the input values of the parameters that are fed to the solver. In other words, a gauge can be entirely described by its corresponding input values in a general way, regardless of its geometry. In step 302 of FIG. 3, the goal is to have an accurate estimate of the input values of model parameters used in the CL model (as in step 402) to compute the information matrix. It can be thought of as follows: the same input information is used to generate the information matrix (in FIG. 3) and generate the CL model (in FIG. 4). While conventionally all the terms of the CL model are used to calibrate the CL model, in the embodiments of the present invention, only selected terms of the CL model are used to calibrate the model as a result of the intelligent pattern selection algorithm.

An additional limitation of the currently used calibration methods is that they use aerial image characteristics or other techniques that are not generalizable for any geometry of the test patterns.

As an illustrative example, this particular application chooses a resist model to construct the information matrix, where the resist image RI in an (x,y) plane within the resist layer is represented by, $$RI(x, y) = \sum_{i=1}^{N} c_i T_i^{\sigma_i}(x, y) \qquad \text{(Eq. 1)}$$

The resist model of Equation 1 is a linear sum of N terms, each weighted with a linear coefficient $c_i$. The terms may have some non-linear coefficient, here denoted as $\sigma_i$, which may be for example the standard deviation of a Gaussian vector. An information matrix may be in the following form:

$$\begin{bmatrix} T_1^{\sigma=10}(x_1) & \ldots & T_N^{\sigma=10}(x_1) & T_1^{\sigma=20}(x_1) & \ldots & T_N^{\sigma=20}(x_1) & \ldots & T_1^{\sigma=100}(x_1) & \ldots & T_N^{\sigma=100}(x_1) \\ T_1^{\sigma=10}(x_2) & \ldots & T_N^{\sigma=10}(x_2) & T_1^{\sigma=20}(x_2) & \ldots & T_N^{\sigma=20}(x_2) & \ldots & T_1^{\sigma=100}(x_2) & \ldots & T_N^{\sigma=100}(x_2) \\ \vdots & & \vdots & \vdots & & \vdots & & \vdots & & \vdots \\ T_1^{\sigma=10}(x_K) & \ldots & T_N^{\sigma=10}(x_K) & T_1^{\sigma=20}(x_K) & \ldots & T_N^{\sigma=20}(x_K) & \ldots & T_1^{\sigma=100}(x_K) & \ldots & T_N^{\sigma=100}(x_K) \end{bmatrix}$$

Each row corresponds to a test pattern (k=1 to K) from the initial larger set of test patterns, and $x_k$ is the location of edge for test pattern k on the wafer. Here the 2-dimensional plane $(x_k, y_k)$ is expressed as just $x_k$ for simplicity. There are N terms in the resist model, and each term is represented with a column. These N columns are then repeated for each of the non-linear coefficients. In the above example, $\sigma$=10 to 100, in steps of 10; but any value and step for $\sigma$ can be used. Nominal range of values of $c_i$ and $\sigma_i$ should match the intended range for the calibration. The number of columns in the information matrix varies according to user-selected settings, and the particular computational lithography model used.

Referring back to the solver in step 404, it is to be noted that the entire behavior of the solver is determined by the input variables that are used to generate the information matrix. For example, in an example, the linear solver in step 406 receives four inputs per test pattern per term of the information matrix. For a given test pattern and given term, the four input terms are: two intensity terms and two slope terms at the two points $(x_j, y_j)$ and $(x'_j, y'_j)$ on the wafer, the two points being located on a resist contour. The two points may be starting point and ending point of a CD for a test pattern, which are obtained from experimental measurement or is supplied by the customer.

In a constant threshold resist model, the constant threshold at the two points may be set to zero, resulting in a linear minimization problem, where, $$RI(x_j, y_j) = \sum_{i=1}^{N} c_i T_i^{\sigma_i}(x_j, y_j) = 0 \qquad \text{(Eq. 2)}$$

$$RI(x'_j, y'_j) = \sum_{i=1}^{N} c_i T_i^{\sigma_i}(x'_j, y'_j) = 0 \qquad \text{(Eq. 3)}$$

The values of Ts are known at both the equations 2 and 3, so the values of $c_i$ are calculated in the linear solver. Since the problem is generally overdetermined, it can not be solved exactly, but the best approximations are found. To find the best approximation, image slope is used. For a simple illustrative case, it is assumed that test pattern j is horizontal, (i.e. $y_j = y'_j$). If $RI(x_j, y_j)$ is not exactly zero, then with a linear approximation a crossing point can be expressed as:

$$R(x, y_j) \approx R(x_j, y_j) + (x - x_j) \frac{\partial}{\partial x} R(x, y_j)\big|_{x=x_j} \qquad \text{(Eq. 4)}$$

In this example, the linear solver receives 4 inputs per test pattern per term of the information matrix, i.e. a total of 4NK values as input, where N is the number of linear terms in the resist image expression, and K is the number of test patterns. The behavior of the linear solver is determined by these values only. The non-linear solver uses brute force search or simplex search to sweep through possible values of the non-linear coefficients.

Finally, the information matrix becomes a matrix of the dimension (K×N'), wherein K is the number of gauges and N' is the product of the number of linear terms N and the number of times the non-linear solver loops through the results of the linear solver. Each row corresponds to a test pattern, and each column corresponds to a value of the linear solver.

Thus, the information matrix contains all the inputs of the solving algorithm that calculates model parameters. A person skilled in the art will understand that, while the method to compute the information matrix as described above is specific to the model of Equation 1, the approach can be adapted to other CL models.

Figure 7:
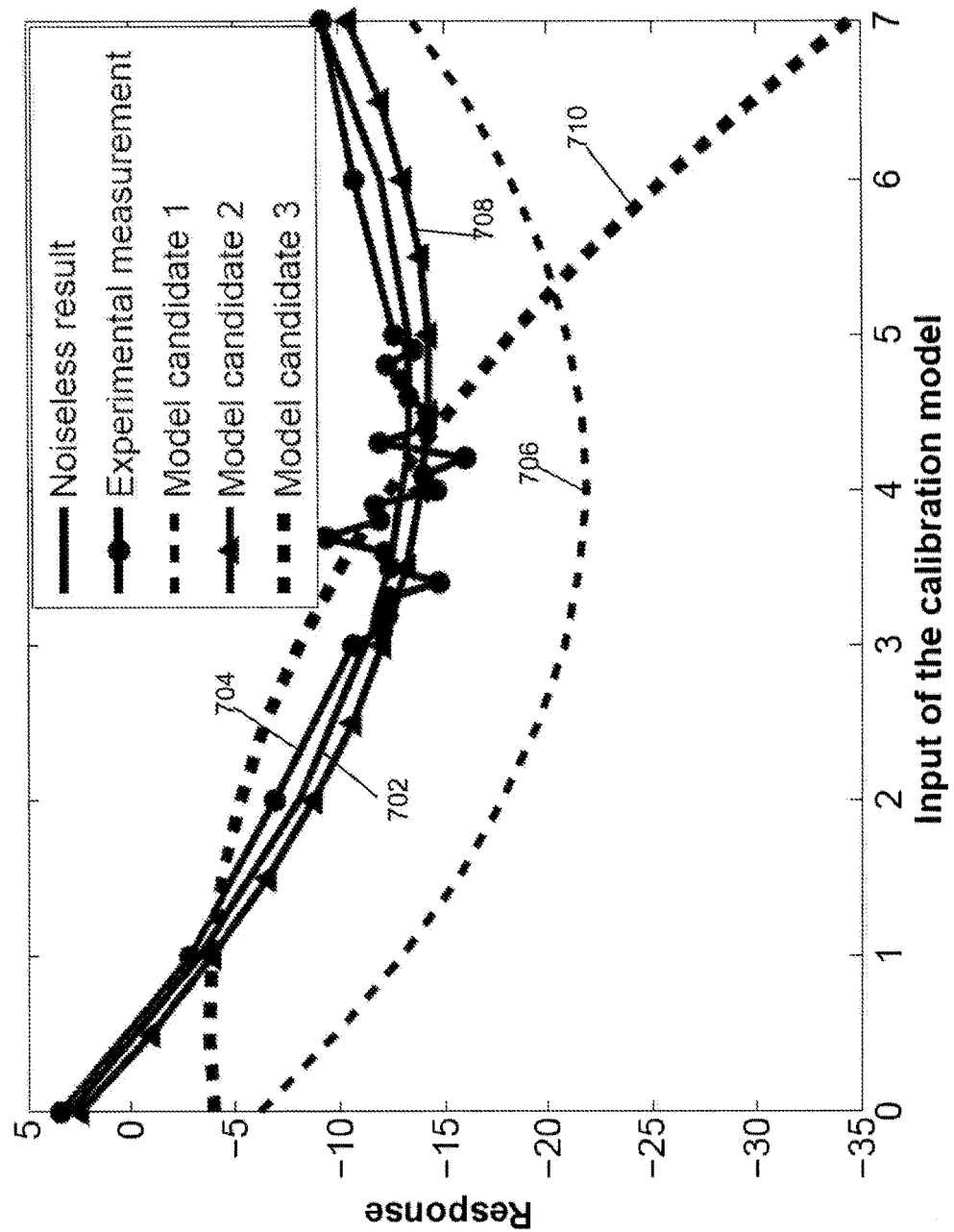
FIG. 7 compares results of a fully physical model with experimental data.

FIG. 7 shows results from a fully physical model, as compared to actual experimental measurement data. A lithographic response is plotted with respect to an input of the calibration model. The x-axis represents a location of a gauge in an one-dimensional parametric space. The plot 704 shows the locations of the gauges from actual experimental measurements. Each dot represents one measurement (one gauge), and they are not uniformly spaced with respect to the x-axis. Curve 702 shows a noise-less curve fitting corresponding to the experimental data points in the plot 704. Each of the curves 706, 708 and 710 corresponds to a different calibration parameter, which is a candidate to be chosen as a model parameter. It is shown that using the calibration parameter 2, the closest fit to the experimental result is obtained. Therefore, candidate model parameter 2 should be chosen as input for the pattern selection algorithm.

Figure 8:
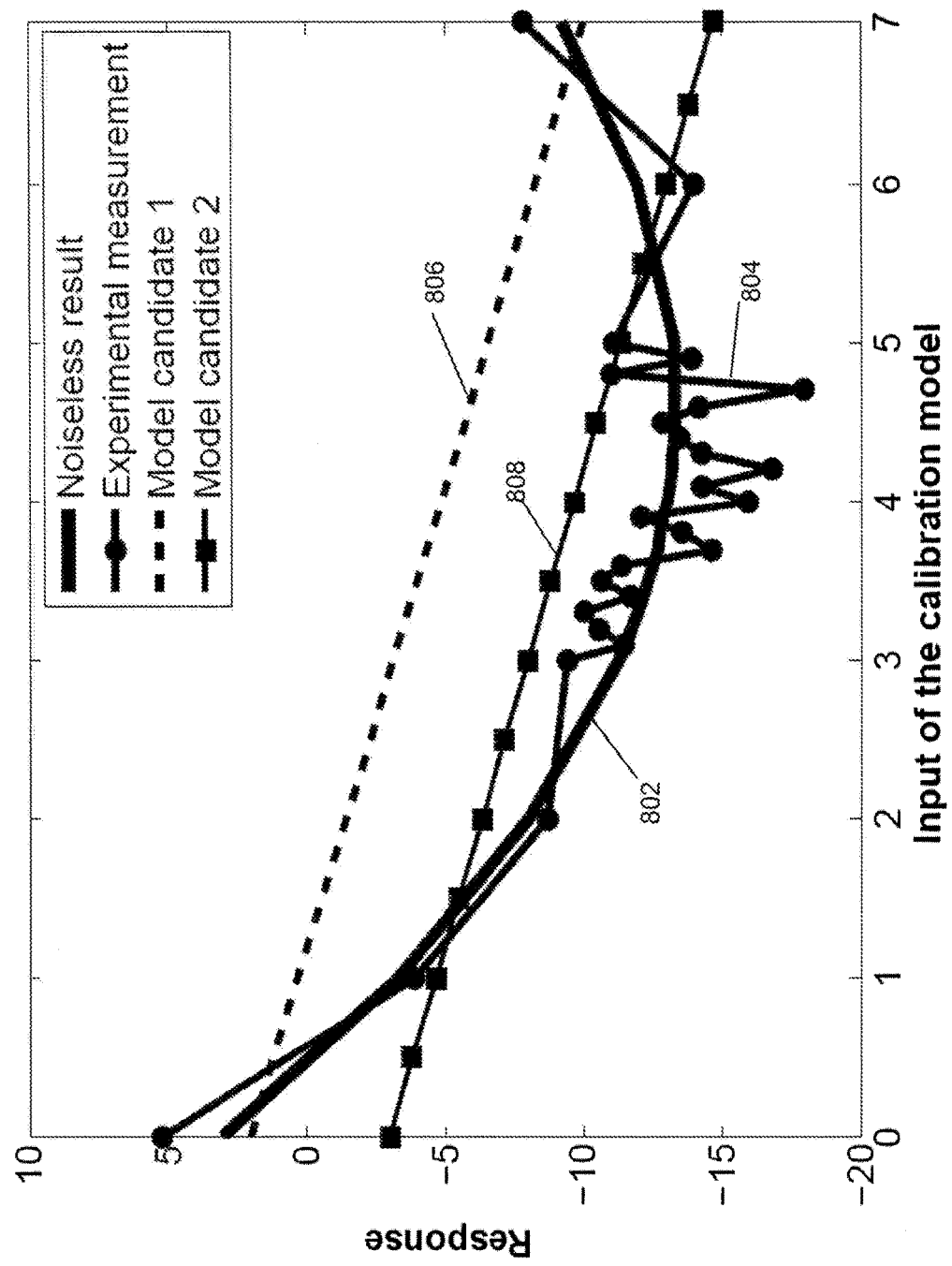
FIG. 8 compares results of an empirical model with experimental data.

FIG. 8 shows results from an empirical model, as compared to actual experimental measurement data. A lithographic response is plotted with respect to an input of the calibration model. The x-axis represents a location of a gauge in an one-dimensional parametric space. The plot 804 shows the locations of the gauges from actual experimental measurements. Each dot represents one measurement (one gauge), and they are not uniformly spaced with respect to the x-axis. Curve 802 shows a noise-less curve fitting corresponding to the experimental data points in the plot 804.

Each of the curves 806 and 808 corresponds to a different calibration parameter, which is a candidate model parameter. It is shown that using the calibration parameter 2, the closest fit to the experimental result is obtained. Therefore, candidate model parameter 2 should be chosen as input for the pattern selection algorithm, and not candidate model parameter 1.

It is noted that for the fully physical model, such as an optical model, based on the first principle, the curve shapes 706 and 708 are similar to the experimental plot, while for the empirical model, such as a resist model, the linear curves 806 and 808 are not necessarily conforming to the general shape of the experimental plot. To compensate for the shape mismatch, x-axis may be sampled uniformly to select the subset of gauges. Usually the extreme points (for example, the gauges at x=0 and x=7) are also included in the subset. In contrast, for the physical model based on the first principle, typically only the extreme points are chosen, i.e. only the gauges at x=0 and x=7 are chosen for the subset. The computational trade-off of selecting more number of gauges in an empirical model may be justified by the fact that creation of the empirical model itself (prior to the gauge selection algorithm is run) is computationally simpler than creation of the physical model from the first principle. However, persons skilled in the art will understand that the methods of the present invention in generic enough to support different kinds of gauge selection algorithms. A person skilled in the art will see that in the case of a first-principle-based model, the most extreme values should be selected, as in the case of the co-pending patent application Ser. No. 12/613,244, published as US 2010/0122225, to Cao et al. On the other hand, in the case of an empirical model, it is better to sample uniformly within the parametric space. One of the emphasis of the embodiments of the present invention is recognizing that in an empirical model, an optimal gauge selection algorithm spans the parametric dimension in a substantially uniform fashion.

A person skilled in the art will see that the two selection methods can be used interchangeably, i.e. either the extreme points may be chosen, or uniform sampling may be employed, including or excluding the extreme points, regardless of whether the model is first-principle-based, empirical, or in between.

A. Gauge Selection Algorithm

Once the information matrix is formed, a smart selection algorithm needs to be executed to select the subset of test patterns that adequately represents the entire larger set of test patterns. The selection is split in two algorithms. The inner algorithm takes as input the information matrix described above, and a radius. With these two parameters, it selects a number of gauges 'n' and returns this number. The outer algorithm repeatedly calls the inner algorithm, searching for the radius value that gives the desired number of gauges K', which may be different from 'n' but substantially close. Once the optimal radius has been determined, the inner algorithm is called another time to obtain the proper number of gauges.

The approach is to minimize the distance in a multidimensional parametric space. If the information matrix is K by N', we interpret it as K points (one per gauge) in a N-dimensional space, with a regular Euclidian norm (Euclidian distance). A person skilled in the art will understand that the use of the Euclidian norm naturally captures the effect of correlated responses without the need for predefined rules. However, the algorithm may accommodate predefined rules based on one or more of: proximity from a determined effective center of gravity of a cluster of data points; one or more predefined radii from a reference point in the parametric space; and predefined respective weighting factors associated with individual test patterns in the larger set of test patterns etc., as described below. The data points correspond to and/or represent the various test patterns. Usually the data points correspond to actual test patterns. However, it is possible that a data point is just a mathematical solution that does not correspond to a particular test pattern, but represents particular test pattern(s) in the data point's vicinity in the solution space. For speed, we can reduce the dimensionality N, with a singular value decomposition (SVD). If we keep only the top most significant dimensions, we will approximate the norm with maximum accuracy. This naturally expresses the correlations, but does not change the results significantly, resulting in acceleration of computation time.

An illustrative non-limiting example algorithm (split into an inner component and an outer component) for intelligent test pattern selection is described below.

A.1. Inner Algorithm

Initialize array STATUS[1 . . . K]←UNASSIGNED (One for entry per gauge)
WHILE there is at least one gauge marked as UNASSIGNED
Compute mu←center of gravity of UNASSIGNED gauges
find j*←UNASSIGNED gauge that is the FARTHEST away from mu
set STATUS [j*]←PICKED
find {j1, j2, . . . }←gauges such as Euclide_dist(mu, gauge (j))<RADIUS
set STATUS[j1, j2, . . . ]←ASSIGNED
END This algorithm obviously terminates when one or ore predefined convergence criteria are satisfied and may have several refinements. Since the gauges may have weights $w_k$, we can use them in the algorithm in the following way:

when computing 'mu,' the center of gravity, we can optionally take into account the weights;
when finding j* we can either pick the one that is the farthest or the closest with respect to 'mu';
when finding j* we can either use the simple distance or weight the distance by $w_j$ (when picking the one that is the farthest) or $1/w_j$, (when picking the one that is the closest). This allows to favor gauges with higher weight.

In practice, we observed that the best results are obtained with: when computing mu with weights; when the gauge that is the farthest is picked; and when the distance is weighted by $1/w_j$. The weighting factor may be related to a relative importance of a test pattern, experimental measurement quality, identification of a hot/warm spot during verification, or a combination thereof.

A.2. Outer Algorithm

The outer algorithm is a simple search. We repeatedly call the inner algorithm with various values for the radius. Since the number of selected gauges vary quasi monastically with respect to the radius, several methods can be used.

The first step is to find an upper bound for the radius. We compute the maximum distance of the cloud of gauges and set this as the radius. If we use this radius, we will select too few gauges. The second step is to find a lower bound for the radius. We divide the previous radius by two, until we select twice too many gauges that we need. The third step is a simple search. We have an upper bound where we select too few gauges and a lower bound where we select too many. With a simple bisection search, we find the optimal radius that results in having the intended number of gauges. While the number of gauges select as a function of the radius is not strictly monotonically decreasing, it is roughly the case and the algorithm, in practice, selects the intended number of gauges by iteration.

Persons skilled in the art will recognize that the gauge selection algorithm described above is just one of many approaches of sampling uniformly. They will also recognize that other algorithm that sample uniformly can be devised, and they may or may not use inner and outer algorithms as described here in the illustrative example.

Figure 5:
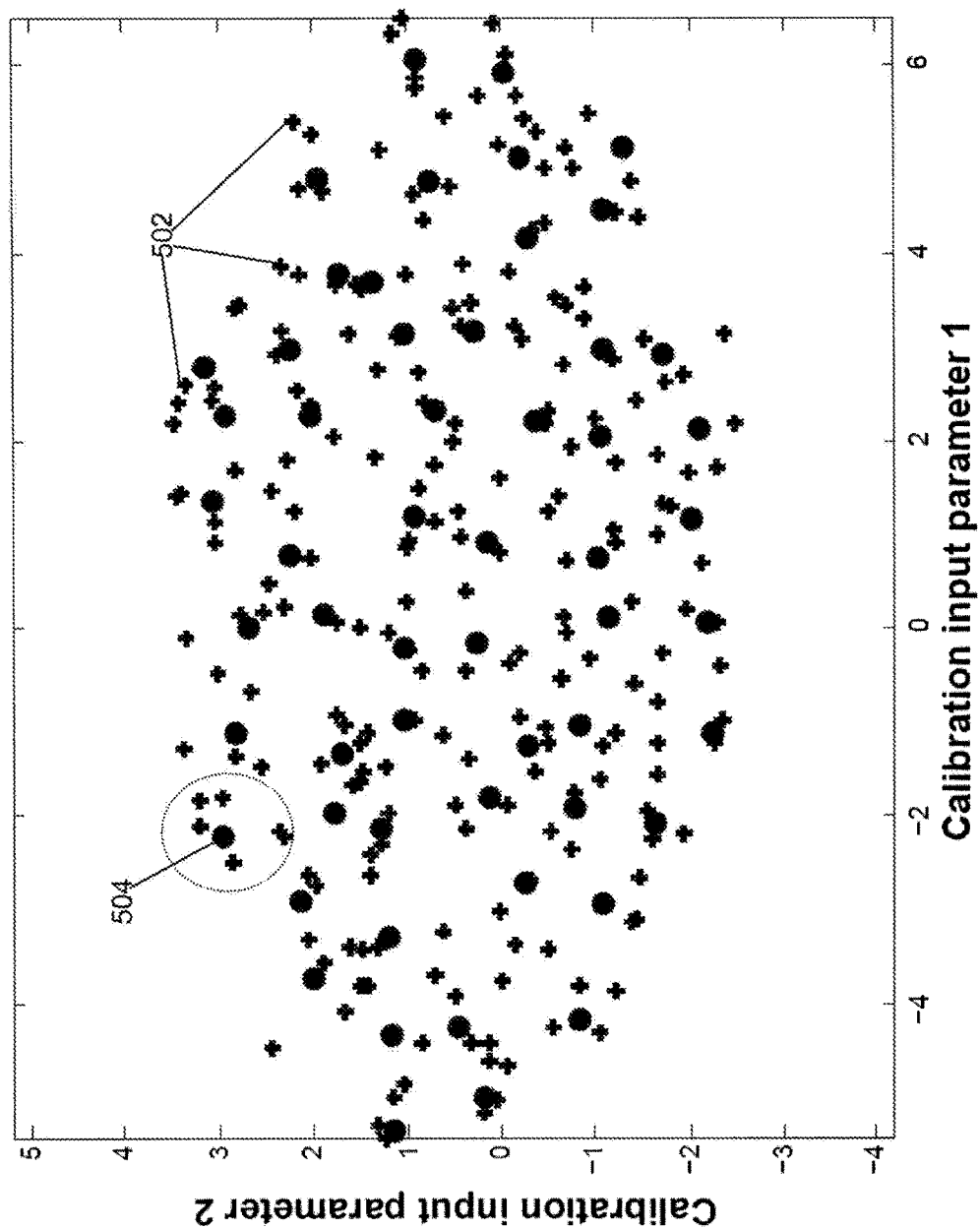
FIGS. 5 and 6 respectively illustrate 2D and 3D representation of test patterns in parametric space; according to aspects of the present invention.
Figure 6:
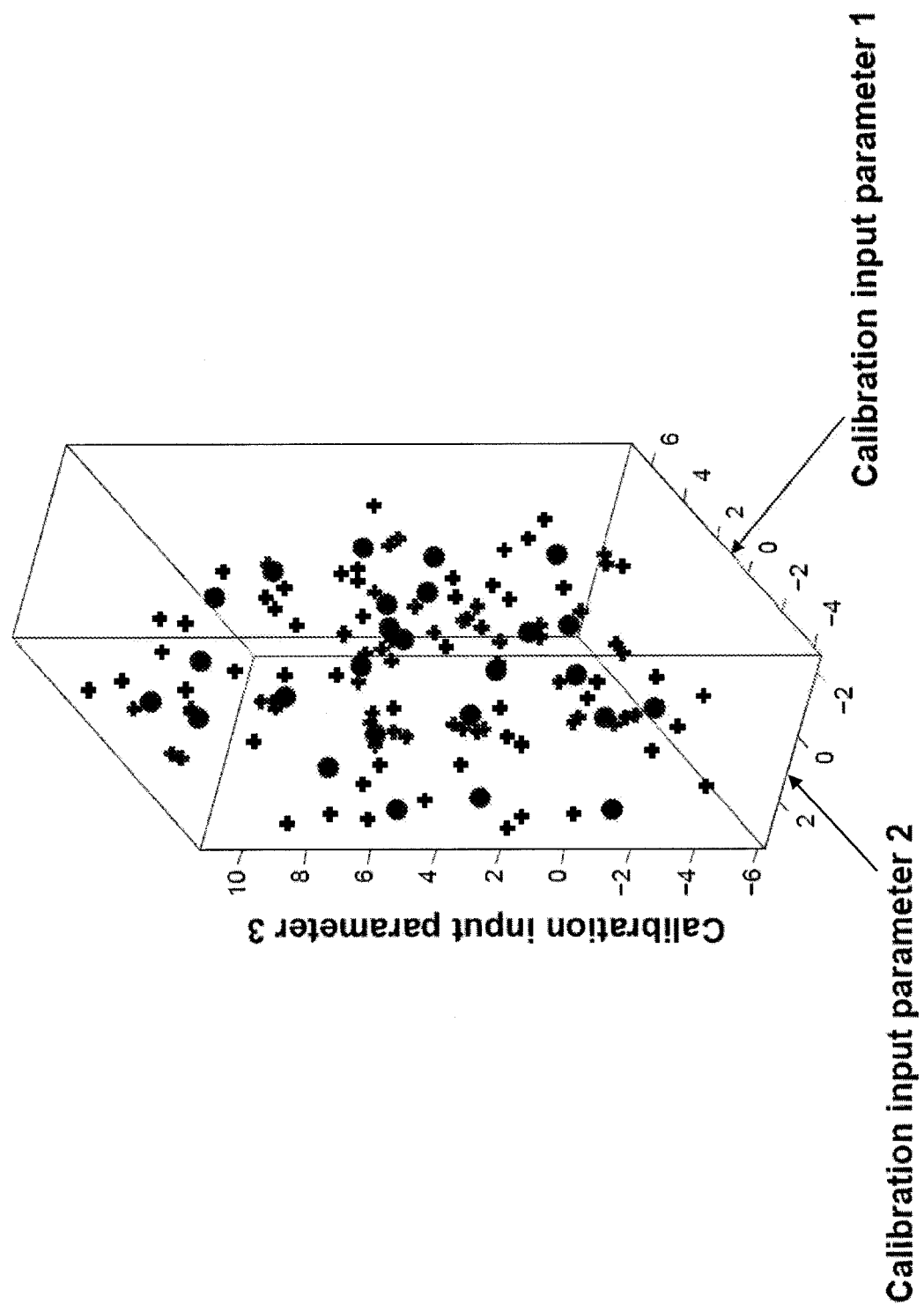

FIG. 5 and FIG. 6 show simplified visualization of the pattern selection algorithm in parametric space. In FIG. 5, it is assumed that the information matrix has only two calibration input parameters. So in a 2-dimensional parametric space, each of the K gauges are denoted by the '+' marks 502. For a cluster of gauges, a center of gravity is selected. The test patterns closest to (or farthest from) the center of gravity is denoted by the '•' marks. For example 504 is the test pattern closest to the center of gravity of the 6 gauges within the cluster denoted by the dashed circle. A test pattern might or might not coincide with the location of the center of gravity. The pattern selection algorithms find out the subset of the gauges based on Euclidian distance or weighted Euclidian distance from the center of gravity for each cluster. FIG. 6 also shows the individual gauges and the gauges closest to (or farthest from) the centers of gravities for various cluster of gauges as '+' and '•' marks, respectively. The only difference between FIGS. 5 and 6 is that in FIG. 6, the parametric space is 3-dimensional, i.e. the information matrix provides three calibration input parameters.

Persons skilled in the art will understand that, although the invention has been described in an example application of lithography model calibration, it is possible that aspects of the invention can be applied to calculating individual terms in resist modeling, differential optical modeling, and selection of appropriate model etc.

Figure 9:
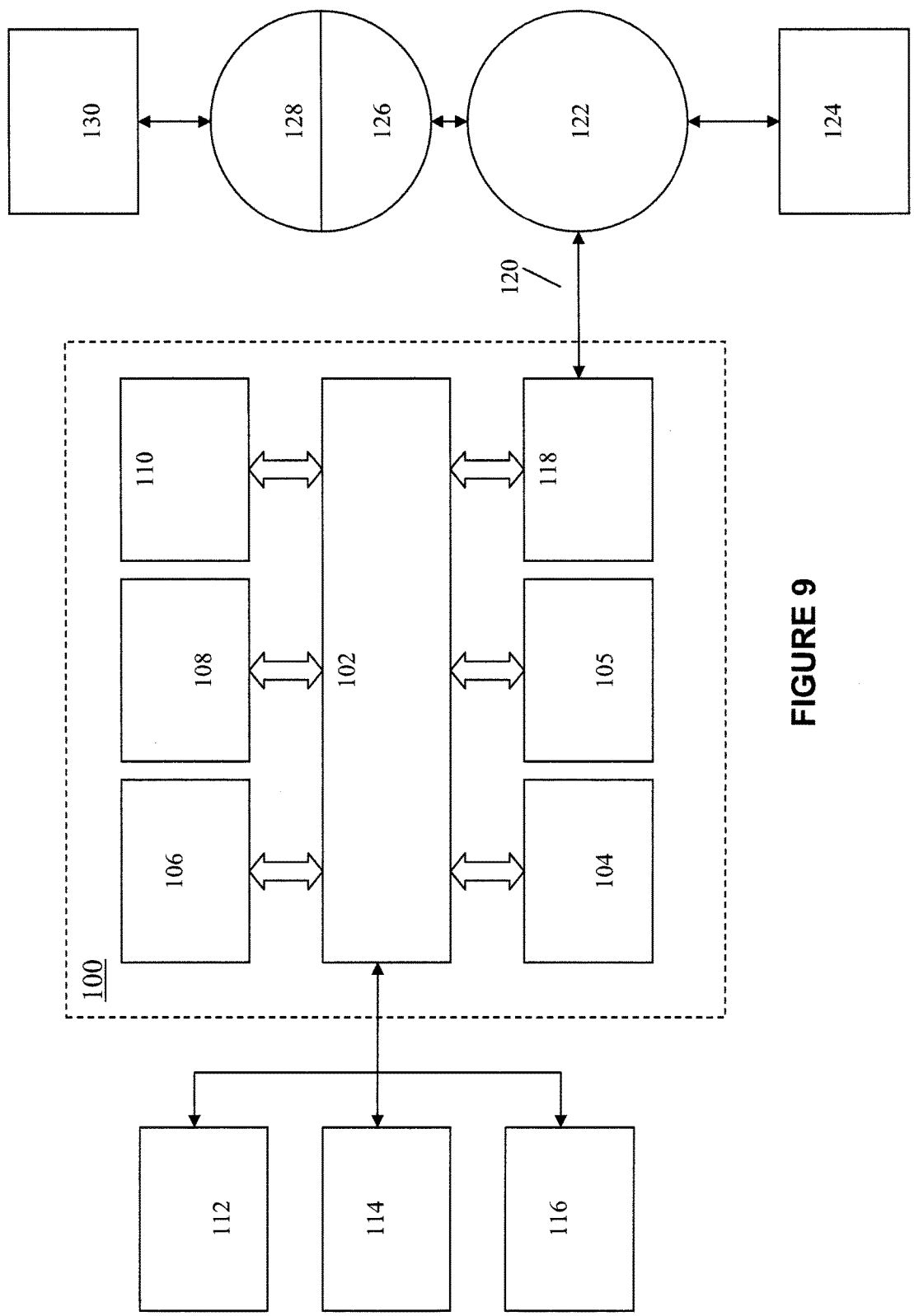
FIG. 9 is a block diagram of an example computer system in which embodiments of the invention can be implemented.

Details of a Computer System for Implementing the Embodiments of the Present Invention FIG. 9 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

Example Lithography Tool

Figure 10:
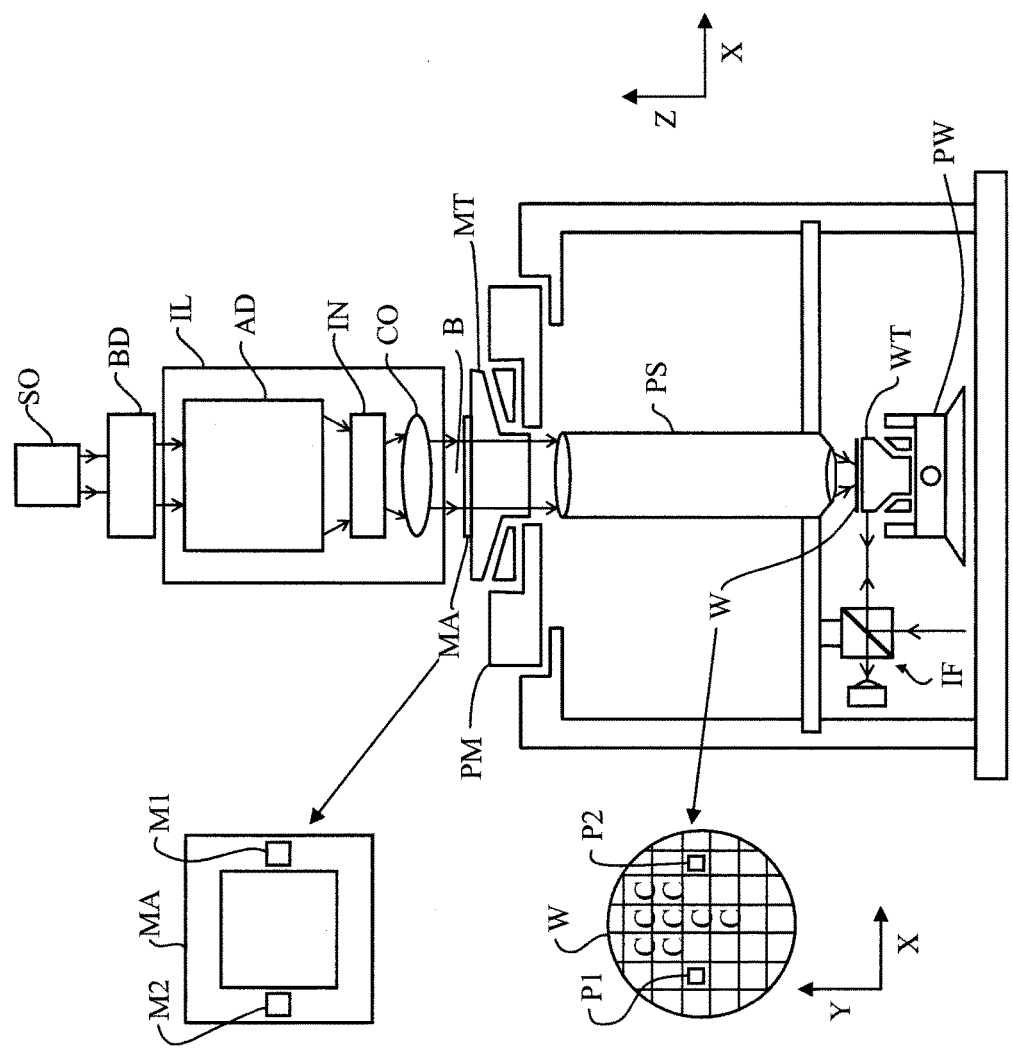
FIG. 10 is a schematic diagram of a lithographic projection apparatus to which embodiments of the invention are applicable.

FIG. 10 schematically depicts an exemplary lithographic projection apparatus whose performance could be simulated and/or optimized utilizing the computational lithography models that are calibrated using the test pattern selection process of present invention. The apparatus comprises:

- a radiation system Ex, IL, for supplying a projection beam B of radiation. In this particular case, the radiation system also comprises a radiation source SO;
- a first object table (mask table) MT provided with a mask holder for holding a mask MA (e.g., a reticle), and connected to first positioning means PM for accurately positioning the mask with respect to projection system PS;
- a second object table (substrate table) WT provided with a substrate holder for holding a substrate W (e.g., a resist-coated silicon wafer), and connected to second positioning means PW for accurately positioning the substrate with respect to projection system PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 10. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modification.

What is claimed is:

1. A method of selecting a subset of test patterns from an initial set of test patterns, the initial set of test patterns having a larger number of test patterns than the number of test patterns in the subset, the method comprising:
    generating an information matrix for the initial set of test patterns, wherein the information matrix comprises an input value for each of a plurality of parameters for variable terms of a computational lithography model that models at least part of a process involving lithography, the input values determined for each of the test patterns in the initial set of test patterns; and
    selecting, by a computer hardware system and based on the information matrix input values of the plurality of parameters determined for each of the initial set of test patterns, the subset of test patterns for calibrating the computational lithography model.

2. The method of claim 1, wherein the selecting explores coverage relationships existing in the initial set of test patterns.

3. The method of claim 1, wherein the input values are determined from a process response that is one or more selected from: critical dimension and/or change in critical dimension of features of the test patterns, a resist image and/or change in resist image, an aerial image intensity and/or change in aerial image intensity when optical settings are changed in the model, and/or changes in aerial image intensity when transmission cross coefficients (TCCs) are tuned in the model.

4. The method of claim 1, wherein the selecting comprises:
    identifying an enclosed region in a parametric space, the parametric space including data points representing the initial set of test patterns, wherein each dimension of the parametric space corresponds to a parameter extracted from the information matrix; and
    selecting data points from within the enclosed region to determine the test patterns to be added to the subset of test patterns.

5. The method of claim 4, wherein the selecting data points comprises selecting data points by sampling uniformly within the enclosed region, thereby selecting the test patterns corresponding to or represented by the selected data points.

6. The method of claim 5, wherein the selection of data points is governed by predefined rules.

7. The method of claim 6, wherein the predefined rules are based on one or more selected from: proximity from a determined effective center of gravity of a cluster of data points; one or more predefined radii from a reference point in the parametric space; and/or a predefined respective weighting factor associated with individual test patterns in the initial set of test patterns.

8. The method of claim 7, wherein the predefined rules are based on a predefined respective weighting factor associated with individual test patterns in the initial set of test patterns and wherein the weighting factor is related to a relative importance of a test pattern, experimental measurement quality, identification of a hot/warm spot during verification, or a combination thereof.

9. The method of claim 5, wherein the method further comprises:
    performing a mathematical search function based on results of the sampling step to determine if too few or too many test patterns have been selected;
    modifying the sampling step to iteratively select an intended number of test patterns.

10. The method of claim 5, wherein sampling uniformly includes selecting data points at extremes of the enclosed region in the parametric space.

11. A computer program product comprising one or more non-transitory computer-readable storage media having computer-executable instructions for causing a computer to select test patterns for calibrating a computational lithography model, the instructions causing the computer to perform the method of claim 4.

12. The computer program product of claim 11, wherein the selecting data points comprises selecting data points by sampling uniformly within the enclosed region, thereby selecting the test patterns corresponding to or represented by the selected data points.

13. The computer program product of claim 12, wherein the selection of data points is governed by predefined rules based on one or more of: proximity from a determined effective center of gravity of a cluster of data points; one or more predefined radii from a reference point in the parametric space; and predefined respective weighting factors associated with individual test patterns in the initial set of test patterns.

14. The method of claim 1, wherein a process response represented by the model is a resist image (RI) in a plane (x,y), and the input values of the model parameters in the information matrix are related to the process response by the following equation, $$RI(x, y) = \sum_{i=1}^{N} c_i T_i^{\sigma_i}(x, y),$$

where RI(x,y) is a linear sum of N number of resist terms T, each having a linear coefficient parameter ci, and a non-linear parameter σi, and where (x,y) are coordinates in the plane of the resist image.

15. A computer program product comprising one or more non-transitory computer-readable storage media having computer-executable instructions for causing a computer to select test patterns for calibrating a computational lithography model, the instructions causing the computer to perform the method of claim 14.

16. The method of claim 1, wherein the information matrix input values are generated by using received input values of the model parameters, wherein the received input values comprise estimates of the values that are supplied to a solver that accommodates the lithography model to generate expanded terms of the lithography model.

17. The method of claim 16, wherein, for a given test pattern and a given term of the model, the input values received are based on: a first intensity term and a first slope term at a first point (xj, yj) on a wafer, and, a second intensity term and a second slope term at a second point (xj', yj') on the wafer, the two points being located on a resist contour.

18. A computer program product comprising one or more non-transitory computer-readable storage media having computer-executable instructions for causing a computer to select test patterns for calibrating a computational lithography model, the instructions causing the computer to perform the method of claim 1.

19. The computer program product of claim 18, wherein the selecting explores coverage relationships existing in the initial set of test patterns.

20. The computer program product of claim 18, wherein the input values are determined from a process response that is one or more selected from: critical dimension and/or change in critical dimension of features of the test patterns, a resist image and/or change in resist image, an aerial image intensity and/or change in aerial image intensity when optical settings are changed in the model, and/or changes in aerial image intensity when transmission cross coefficients (TCCs) are tuned in the model.

21. The method of claim 1, wherein a linear solver calculates input values of linear coefficients, and a non-linear solver calculates input values of non-linear parameters for the information matrix, wherein the linear solver and the non-linear solver are chosen depending on the computational lithography model to be calibrated.

22. The method of claim 21, wherein the computational lithography model comprises a first-principle-based model, an empirical model, or a combination thereof.

23. The method of claim 1, wherein each test pattern of the initial set has a different characteristic feature correlated to one or more different parameters of the computational lithography model.

24. The method of claim 1, wherein the subset of test patterns effectively determines input values of the model parameters that contribute more than other test patterns in a process response, wherein the subset of test patterns characteristically represents the initial set of test patterns.

* * * * *